United States Patent [19]

Rejman-Greene et al.

[11] Patent Number: 5,428,466
[45] Date of Patent: Jun. 27, 1995

[54] NEURAL NETWORKS

[75] Inventors: Marek A. Z. Rejman-Greene; Edward G. Scott; David C. Wood; Peter Healey; Roderick P. Webb, all of Suffolk, England

[73] Assignee: British Telecommunications public limited company, London, England

[21] Appl. No.: 859,698
[22] PCT Filed: Nov. 20, 1990
[86] PCT No.: PCT/GB90/01782
  § 371 Date: Jun. 11, 1992
  § 102(e) Date: Jun. 11, 1992
[87] PCT Pub. No.: WO91/07714
  PCT Pub. Date: May 30, 1991

[30] Foreign Application Priority Data

Nov. 10, 1989 [GB] United Kingdom .................. 8926183
Feb. 15, 1990 [GB] United Kingdom .................. 9003443
Nov. 8, 1990 [GB] United Kingdom .................. 9024332

[51] Int. Cl.⁶ ............................ G02B 5/32; G03H 1/12
[52] U.S. Cl. .......................................... 359/15; 359/1; 359/11; 359/561
[58] Field of Search ................ 359/1, 11, 15, 10, 559, 359/561, 565, 566, 567; 395/21, 25; 364/807, 822, 841, 359, 395

[56] References Cited

U.S. PATENT DOCUMENTS

| | | | |
|---|---|---|---|
| 5,004,309 | 4/1991 | Caulfield et al. | 359/1 |
| 5,068,801 | 11/1991 | Clark et al. | 359/25 |
| 5,121,231 | 6/1992 | Jenkins et al. | 359/7 |
| 5,129,041 | 7/1992 | Pernick et al. | 359/25 |

OTHER PUBLICATIONS

IEEE International Conference on Neural Networks, 24–27 Jul. 1988, San Diego, Calif., IEEE, (New York, US), J. Singh et al: "Implementation of Neural Networks Using Quantum Well Based Excitonic Devices—Device Requirement Studies."

Optics Letters, vol. 13, No. 3, Mar. 1988, Optical Society of America, (New York, US), J. S. Jang et al: "Optical implementation of the Hopfield model for two-dimensional associative memory:", pp. 248–250.

Scientific American, vol. 256, No. 3, Mar. 1987, (New York, US), Y. S. Abu-Mostafa et al: "Optical neural computers", pp. 66–73.

Primary Examiner—Loha Ben
Assistant Examiner—Darryl J. Collins
Attorney, Agent, or Firm—Nixon & Vanderhye

[57] ABSTRACT

A neural network has inputs formed by square array of optical modulators $M_{ij}$ and outputs by optical detectors $D_{ij}$ coupled to threshold comparators. A holographic plate includes a spatial modulator whose elements are controlled by a controller to form an array of optical beams from a coherent optical source. Each optical beam optically interconnects a modulator $M_{ij}$ with a respective detector $D_{ij}$. The weight values of the neural network are provided by the intensities of the optical beams. This obviates the need for an optical weighting mask between an array of light emitting diodes and a detector array allowing a higher density of lower power consumption components and reprogrammability of the network.

18 Claims, 5 Drawing Sheets

NEURAL NETWORKS

BACKGROUND OF THE INVENTION

1. Field of the Invention

This invention relates to neural networks and in particular to optical neural networks.

2. Related Art

Neural networks are networks modeled on the interconnections of neurons in animals in which each node of the network, corresponding to a neuron, has an output which depends on the total value of inputs to that node, each input being given a weight value.

One example of the neural network is the single layer neural network in which each neural node sums the weighted values of a set of inputs. In such networks, in particular, the number of interconnections between input and output nodes grows rapidly as the number of output nodes increases. As pointed out by Mitsubishi Electric Corporation in their article in JETRO, Mar. 1989 entitled "Optical Neurochip Developed" the minimum number of nodes for a commercially realisable neural network is of the order of 1000 which requires 1 million interconnections, a number with which existing LSI circuit technologies cannot cope.

The approach of Mitsubishi was to interconnect the input and output nodes by means of optical beams. They constructed an optical neural network in which a single neuron was represented by a line detector which provided a summed output of light inputs as the input for a threshold comparator, a column of line optical sources in the form of light omitting diodes provide inputs to the neuron, and an optical mask between the line sources and line detectors provides a light intensity from a particular diode corresponding to its weight value in the neural net. The remaining output nodes were provided by further rows of optical detectors and associated threshold detectors positioned to receive optical input from the columns of light emitting diodes via the optical mask. Whether a particular input optical beam impinged on a photodetector was determined by switching the light emitting diode on or off.

SUMMARY OF THE INVENTION

According to the present invention, a neural network has at least one node responsive to the weighted sum of a plurality of inputs to provide an output dependant on said weighted sum, the node comprising an optical detecting means and the inputs comprising input optical beams whose intensities determine the weight values of the inputs, the network including a holographic means for generating the input optical beams and an array of optical modulators for controlling which of the input optical beams impinge on the optical detectors.

The use of a holographic means to provide optical beams allows the provision of the required optical interconnections without the need to fabricate an array of light emitting diodes. As the modulators have a lower power consumption than light emitting diodes, this method of forming the optical beams allows the neural network elements to be fabricated in higher densities and be driven at a faster rate than possible before.

The optical detecting means may be a series of optical detectors or a single line detector, for example.

The structure of the present invention also allows the modulators and optical detectors to be formed as fixed, compact devices in a neural network the programing of which can be readily changed by changing the intensity distribution of optical beams generated externally to them. In particular the removal of the need for a mask between the inputs and neural nodes permits the use of the particularly compact structure of modulators and optical detectors described fully in the applicant's co-pending application GB 8926183, namely one in which they are formed on respective sides of a common substrate, for example based on multiple quantum well structures formed by double-sided epitaxy.

The single source of optical power required to illuminate a hologram of the holographic means needs to be as powerful as the sum of the powers of the equivalent number of light emitting diodes but it has the advantage that the optical beams are more readily and simultaneously matched to detectors' sensitive wavelength. The hologram may provide equal intensity beams which then pass through an optical mask to provide the desired weighting values. Preferably, however, the hologram produces directly the intensities of input optical beams corresponding to the weight values because the optical power of the source is used more efficiently in that there is no need for an intervening mask which absorbs optical power.

The hologram may be positioned between a pair of collimating lenses to simplify the design and fabrication of the hologram. Preferably the hologram incorporates the phase structure of such a pair of lenses to reduce the number of optical components.

The hologram or mask may be formed from a spatial light modulator with means for setting the hologram or mask to one of several patterns corresponding to different neural network weight values.

The hologram or mask may be removably mounted in the network to provide means for adjusting the weighting values of the network. Alternatively, adjustability can be achieved by forming the hologram or mask from a changeable spatial light modulator.

Where adjustability is required a plurality of holograms may be provided each for providing different weighting values of optical beams for interconnecting the modulators and detectors. The desired hologram may be selected by selective illumination from a single optical source via an intervening changeable mask or by associating each hologram with a distinct optical source, which sources illuminate only the respective hologram.

BRIEF DESCRIPTION OF THE DRAWINGS

Embodiments of the present invention will now be described, by way of example only, with reference to the accompanying drawings in which.

DETAILED DESCRIPTION OF EXEMPLARY EMBODIMENTS OF THE INVENTION

Figure 1:
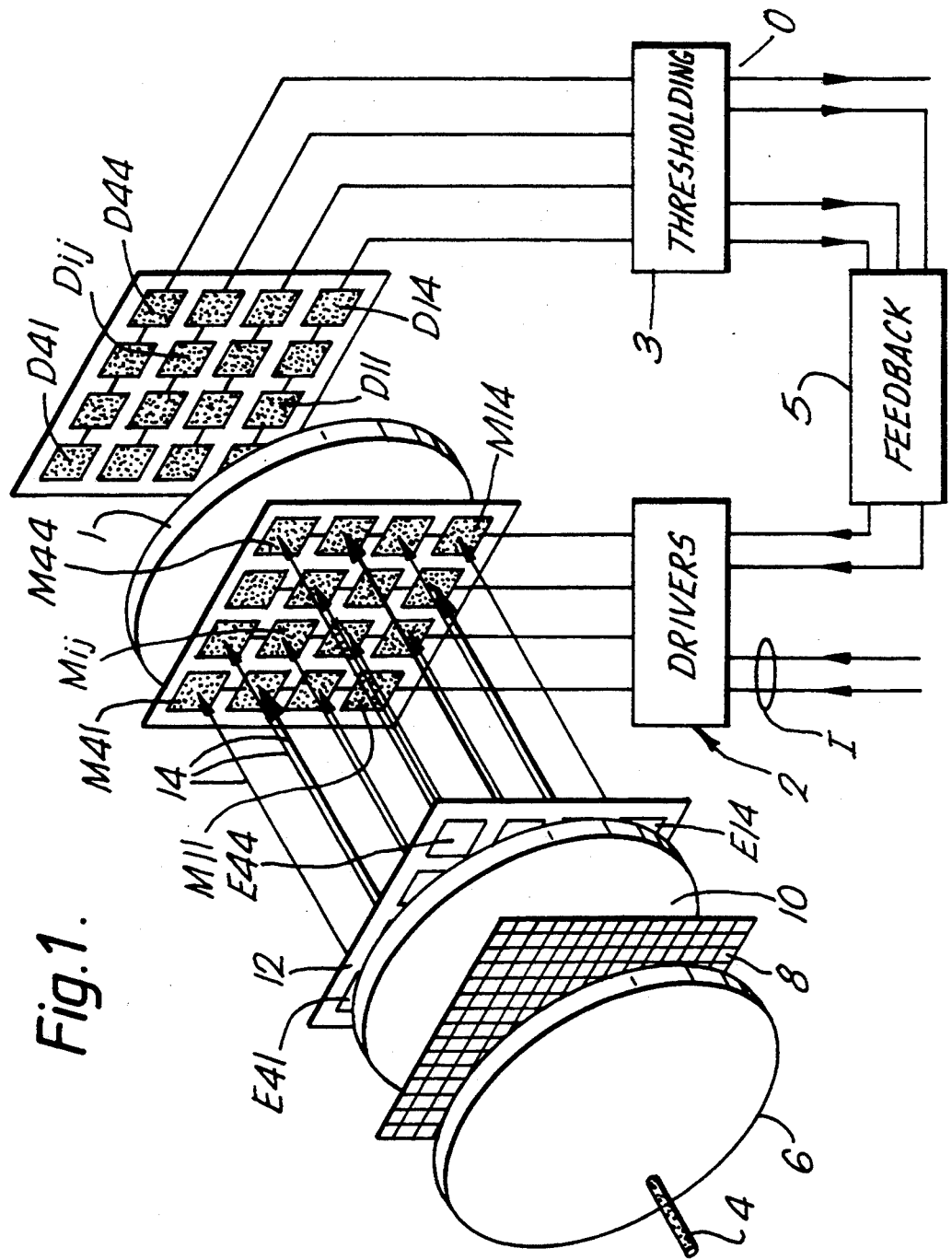
FIG. 1 is a schematic diagram of a first embodiment of a neural network according to the present invention using a weighting mask.

Referring to FIG. 1 a neural network has sixteen multiple quantum well (MQW) optical modulators $M_{ij}$, $i,j=1$ to 4 and sixteen MQW optical detectors $D_{ij}$, $i,j=1$ to 4 each formed as a square array on respective sides of a lens 1 which focuses light transmitted by modulator $m_{ij}$ on the corresponding detector $D_{ij}$. An optical beam passing through a modulator $m_{ij}$ is thereby optically interconnected to the corresponding detector $D_{ij}$.

The modulators $M_{ij}$ in a given column 1 are switched on and off together by one of the drivers 2. The detectors $D_{ij}$ in each of the rows j are coupled together so that the sum of the photocurrent from the row can be obtained. Each row of detectors $D_{ij}$ therefore forms the weighted sum of the light intensities passing through the modulators $M_{ij}$, $i=1$ to 4. The summed output of each row of detectors $D_{ij}$ is coupled to the thresholding device 3.

Output signals from the thresholding device 3 are fedback via the feedback element 5 to the drivers 2. On providing input signals to input ports I of the drivers 2 the net will settle to a stable state with output signals corresponding to the input signals being made available at output ports 0 of the thresholding elements 3. An example of such operation will be described in more detail later with reference to FIG. 5. It should be understood, however, that this invention is not concerned with or limited to the particular inputs, feedback mechanism or threshold jag described in this application.

A source of optical coherent radiation 4 is collimated by lens 6 to impinge on a holographic plate 8, the light being diffracted into sixteen equal intensity beams which are focused by lens 10 to impinge on an elements $E_{ij}$, $i,J=1$ to 4 optical mask 12. The mask elements determine the intensity $I_{ij}$ of the beams 14 which impinge upon modulators $M_{ij}$. The row of detectors $D_{ij}$, $j=1$ to 4 therefore forms the weighted sum $$S_j = \sum_{i=1}^{4} I_{ij} \cdot M_{ij}$$

where $M_{ij}=1$ if the modulator is transparent and O if opaque. That is, the intensities of the optical beams 14 after passing through the optical mask 12 provide the weighting values of the neural net. The relative weights are indicated in FIGS. 1 and 2 by the width of the arrows representative of the individual beams 14.

Figure 2:
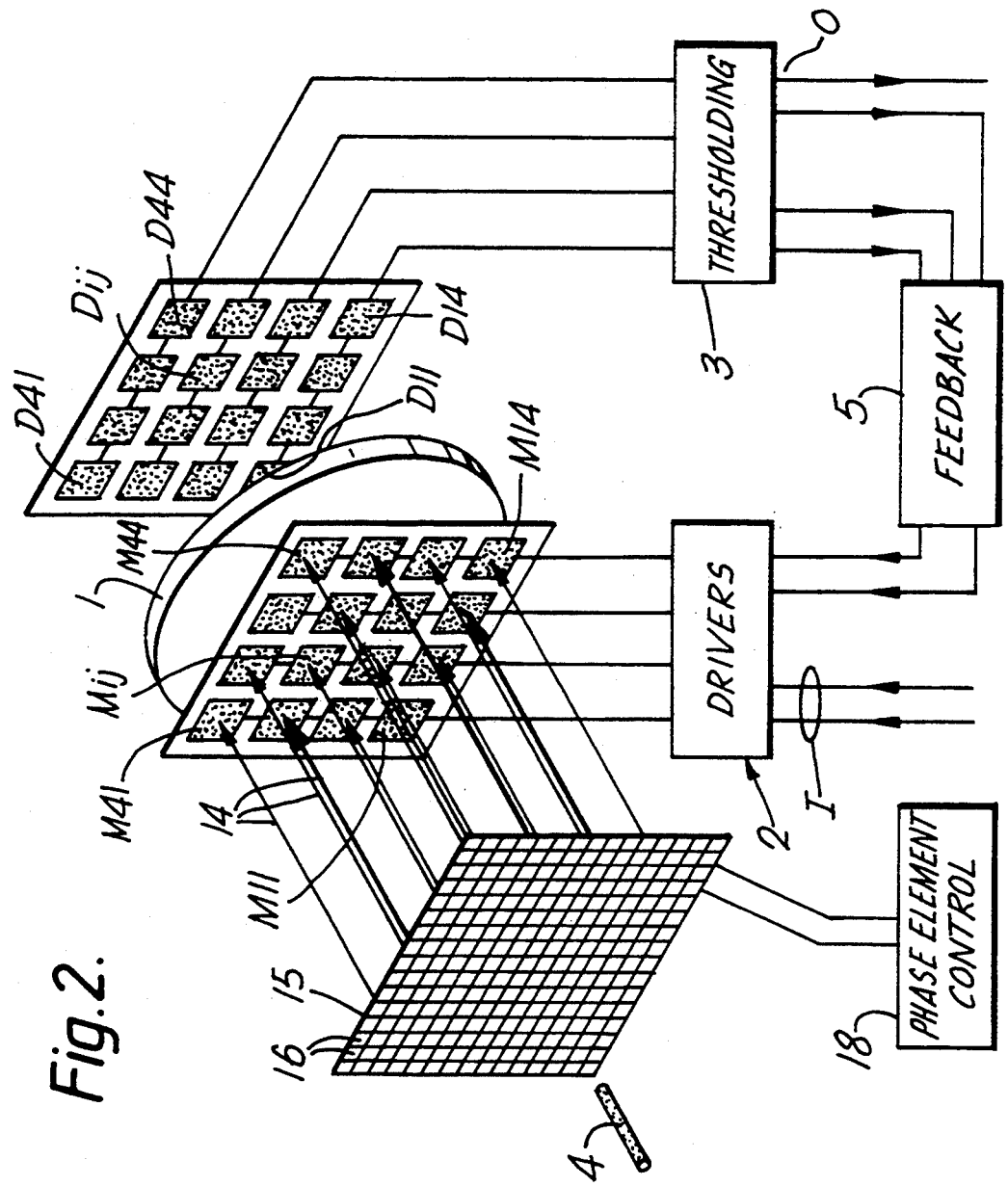
FIG. 2 is a schematic diagram of a further embodiment of a neural network according to the present invention using a weighted hologram.

Referring now to FIG. 2, a neural network is shown which is similar to FIG. 1, the same parts being denoted by the same reference labels, but in which the optical beams of required intensity are produced directly by a holographic plate 15 formed from a spatial light modulator having phase elements 16 controlled by control means 18 which sets the phase elements 16 to the desired pattern to obtain the desired optical beam intensities 14. The hologram 15 incorporates the phase structure of the lenses 6 and 10 of the FIG. 1 embodiment to reduce the number of optical components.

The method of producing holograms for splitting of the source to equal intensity beams are well known and will not be described further. The hologram for splitting the source to different intensity optical beams can be obtained by using interactive methods to form a computer generated hologram in which the desired image corresponds to the desired splitting ratios. The method applied to the formation of equal intensity optical beams is discussed in an article by Feldman and Guest in Optics Letters Vol 14 No. 10 of May 1989 titled "Interactive encoding of high-efficiency holograms for generation of spot arrays" and is readily modified to produce unequal splitting ratios.

Figure 3:
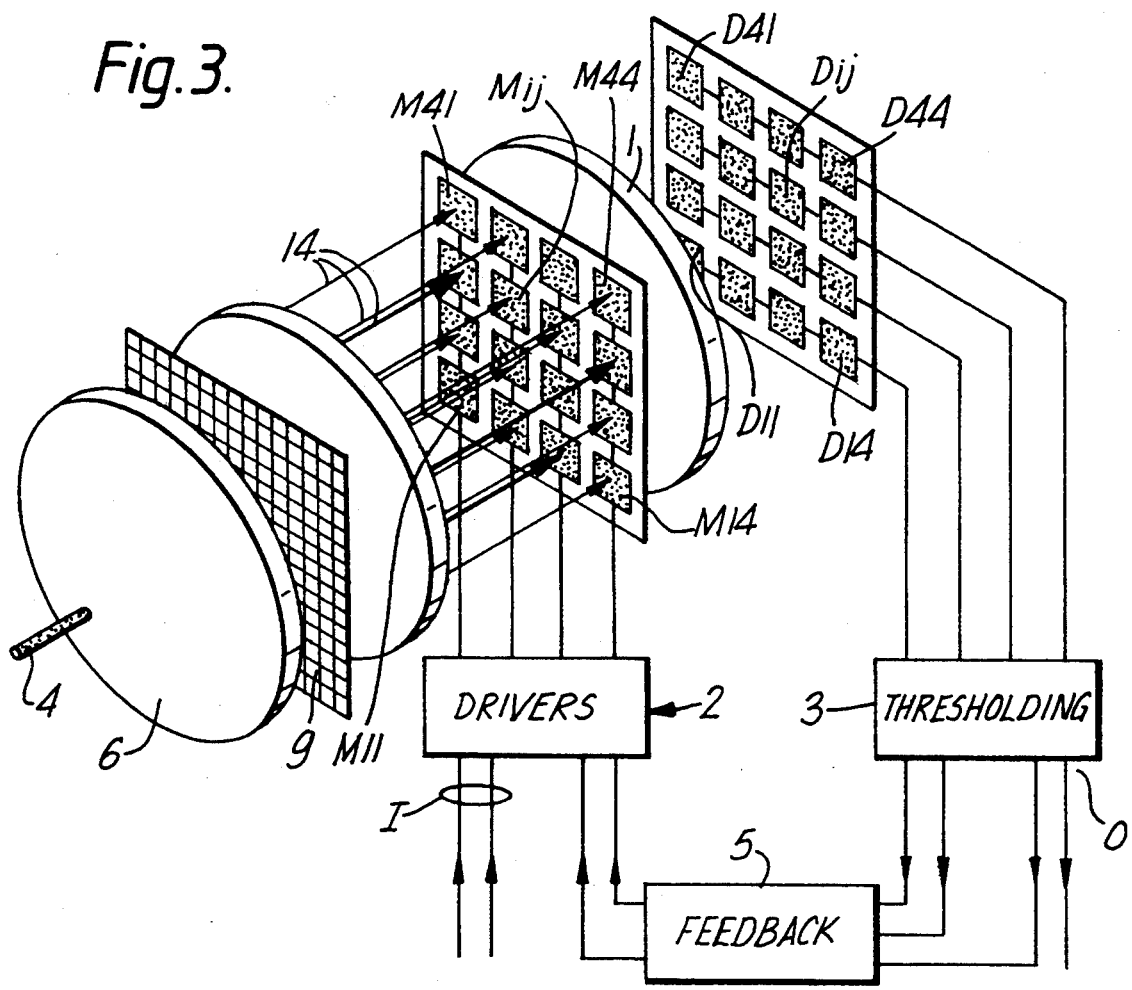
FIG. 3 is a schematic diagram of a further embodiment of a neural network according to the present invention using a weighted hologram.

In the embodiment of FIG. 3 the weighted input optical beams 14 are produced by a removable hologram 9 between a pair of lenses 6 and 10 as in the embodiment of FIG. 1.

Figure 4:
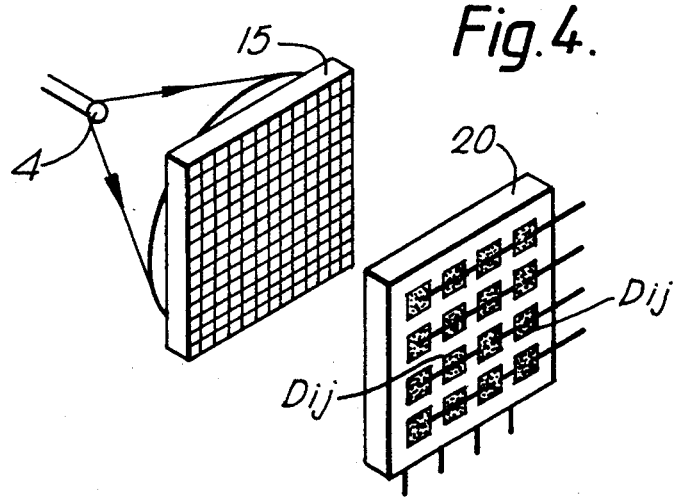
FIG. 4 is a schematic diagram of a further embodiment of a neural network according to the present invention using a double-sided epitaxy multiple quantum well modulators/optical detectors.

Referring now to FIG. 4 there is shown schematically a neural net as shown in FIG. 2 in which the modulators (not shown) and detectors $D_{ij}$ are fabricated on respective sides of a common substrate. The fabrication of modulator/detector multiple quantum well arrays by double-sided epitaxy is described in the applicant's co-pending application GB8926183 filed 20th Nov. 1989.

Figure 5:
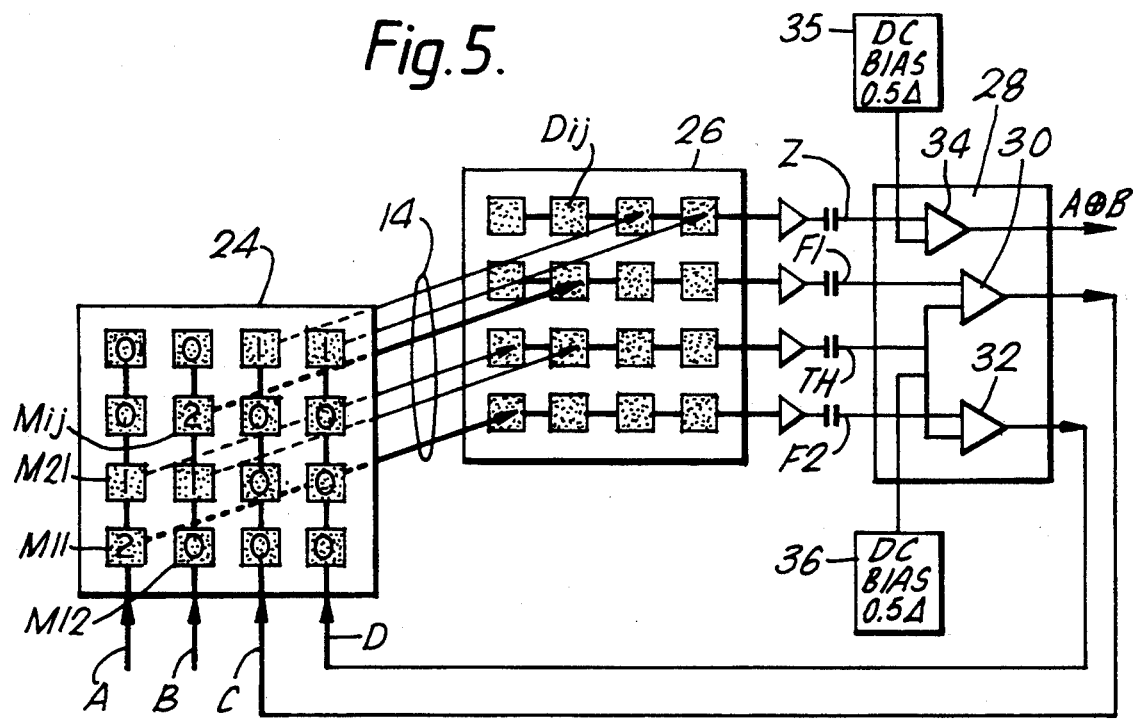
FIG. 5 is a schematic diagram of the embodiment of FIG. 1 configured as an exclusive-or circuit.

Referring now to FIG. 5 feedback in a neural net according to the present invention is described which produces as an output the exclusive-OR operation on two inputs by way of example.

Elements $M_{ij}$ of modulator array 24 are optically coupled to detectors $D_{ij}$ of a detector array 26 by intensity weighted optical beams 14 generated for example by holographic means of either FIGS. 1 or 2. The weighting given to each modulator element $M_{ij}$ is denoted by the corresponding numeral on the drawing. For example the weighting for element $M_{11}$ is 2, for $M_{21}$ 1, and for $M_{12}$ 0, and so on.

The modulators $M_{ij}$ may be multiple quantum well devices for example. Each modulator in a column is turned on and off by a respective input A, B, C or D. When a logical input of 1 is applied to an input A,B,C or D the weighted input beams 14 corresponding to the elements in that column are allowed to pass through to the detector array 26.

The detectors $D_{ij}$ in each row of the array 26 are coupled together to provide signals representative of the sum of the intensities detected by the detectors in a row, indicated by Z, F1, TH and F2, where $\Delta$ is the change in voltage in a detector associated with one unit of detected optical intensity.

The relationship between logical inputs at A and B and the outputs F1, F2 and TH are shown in the first five columns table 1.

TABLE 1

| A | B | F1 | F2 | TH | | C | | D | | Z | A | B | |
|---|---|----|----|----|---|---|---|---|---|---|---|---|---|
| 0 | 0 | 0 | 0 | 0 | 0 | (F1<TH+0.5Δ) | 0 | (F2<TH+0.5Δ) | 0 | 0 | (Z<0.5Δ) |
| 0 | 1 | 2Δ | 0 | 1Δ | 1 | (F1>TH+0.5Δ) | 0 | (F2<TH+0.5Δ) | 1Δ | 1 | (Z>0.5Δ) |
| 1 | 0 | 0 | 2Δ | 1Δ | 0 | (F1<TH+0.5Δ) | 1 | (F2>TH+0.5Δ) | 1Δ | 1 | (Z>0.5Δ) |
| 1 | 1 | 2Δ | 2Δ | 2Δ | 0 | (F1<TH+0.5Δ) | 0 | (F2<TH+0.5Δ) | 0 | 0 | (Z<0.5Δ) |

So, for example, when A and B=1 $D_{11}$ receives two units of optical intensity and so F2=2Δ; $D_{21}$ and $D_{22}$ each receive one unit of optical intensity so TH=2Δ, and $D_{32}$ receives two units of optical intensity so F=2Δ.

The outputs F1, F2 and TH are input to a thresholding device 28. A D.C. bias of 0.5Δ is provided by bias units 35 and 36. The output of bias unit 36 is summed with output TH from the detector array 26 and coupled to comparator 30 and 32 to provide the threshold levels. Outputs F1 and F2 are coupled to the second inputs of comparators 30 and 32 respectively. Comparator 30 provides a logical output (which comprises input D) of 0 if F1>(TH+0.5Δ) and 1 if F1>(TH+0.5Δ). Similarly, comparator 32 provides a logical output (which comprises input C) of 0 if F2<(TH+0.5Δ) and 1 if F2>(TH+0.5Δ). The values of inputs C and D provided by the threshold jag element 28 for the four different combinations of A and B is also shown in table 1.

In this embodiment, the value of output Z from the detector array 26 is the determined solely by inputs C and D as elements $M_{41}$ and $M_{42}$, corresponding to inputs A and B, have zero weighting.

The output Z from the detector array 26 is compared by comparator 34 to the D.C. bias 0.5Δ to provide a logical output which as shown by table 1 corresponds to the exclusive-or of inputs A and B.

Figure 6:
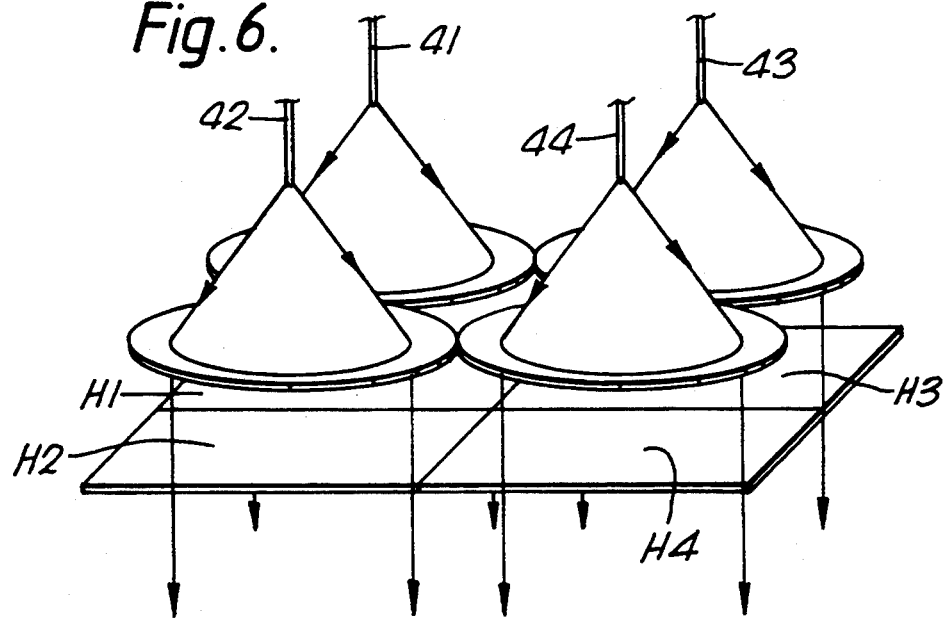
FIG. 6 is a schematic diagram of a multiple hologram source for use with the present invention.

Referring now to FIG. 6 a multiple source of weighted intensity optical beams for use in neural array according to the present invention comprises four holograms H1 to H4 each of which can be illuminated by a corresponding optical source 41, 42, 43 and 44 respectively. Each of the holograms H1 to H4 can be arranged to provide different weighting values of optical beam intensity for a neural net with which it is to be used. By changing the illuminating source 41 to 44, the neural net can be rapidly reconfigured to provide a different function defined by the chosen weighting values associated with the illuminated hologram H1 to H4.

A lens system, not shown, is used to allow each hologram to illuminate the whole modulator array as in the previously described embodiments. The holograms H1 to H4 could be replaced by holograms providing equal beam intensities with which are associated masks to provide the required weighting values. Other multiple source arrangements may also be employed. For example, the holograms H1 to H4 could be illuminated by a single source, the required one being selected by means of a mask between the source and the holograms. Alternatively the holograms H1 to H4 may be formed as a multiple volume hologram illuminated by a single optical source, the appropriate hologram being selected by means of a spatial modulator between the source and the hologram.

It will be appreciated that the present invention is not restricted to any particular size, type or configuration of optical modulators and optical detectors.

A method of determining the weights devised by the applicant which is applicable to the present invention may be based on the fact that the modulation depth that can be achieved at a given wavelength for a multiple quantum well (MQW) modulator is determined not only by the voltage swing of the digital drive but also by the applied bias across the modulators. See FIG. 3 of N. M. Barnes, P. Healey, M. A. Z. Rejman-Greene, E. G. Scott & R. P. Webb, "16 Channel Parallel Optical Interconnect Demonstration with an InGaAs/InP MQW Modulator Array," Elect Lett, 26, 1126–1127 (1990). This behaviour means the modulation depth can be adjusted by changing the bias voltage, even if the voltage swing of the digital drive which determines whether the modulator is in the "on" or "off" state is unaltered. By the addition of a low pass filter to the circuit of FIG. 1, a slowly varying (10–100 KHz) analogue bias voltage can be superimposed onto the fast (about 50 MHz) digital data. Hence the modulation depth, which corresponds to the signal weight, can be changed at a rate of 10–100 KHz. This slowly varying voltage level can be set by standard low-bandwidth analogue drivers under computer control. The hologram that produces the multiple beams no longer has to produce beams with a pre-programmed weight matrix. A uniform array of beams can now be used instead, the weights being determined by the independently adjustable bias voltages on the modulators. Further, the weights can now be adjusted during a training phase for the neural network.

This arrangement of optical neural network provides a means of sending high speed digital data through a neural network while still being able to change the weights at more modest speeds under computer control.

There are other ways in which this high data throughput could be achieved—in particular the data signals could be produced externally and illuminate a sandwich of modulator/detector arrays. The modulators could then be addressed independently to adjust the weights.

The bias voltages which determine the threshold levels can also be adjusted at the same slower timescale in these implementations.

Measuring the similarity of the whole of the output set and target set and adjusting the parameters on this global measure rather than on the similarity of pairs of individual vectors provides enhanced training rates for neural networks having a data throughput rate that can be higher than the rate at which the response determining means can be adjusted. This can speed up training by not limiting the rate of applying the input vectors to the relatively slow weight adjustment rate of the network.

Figure 7:
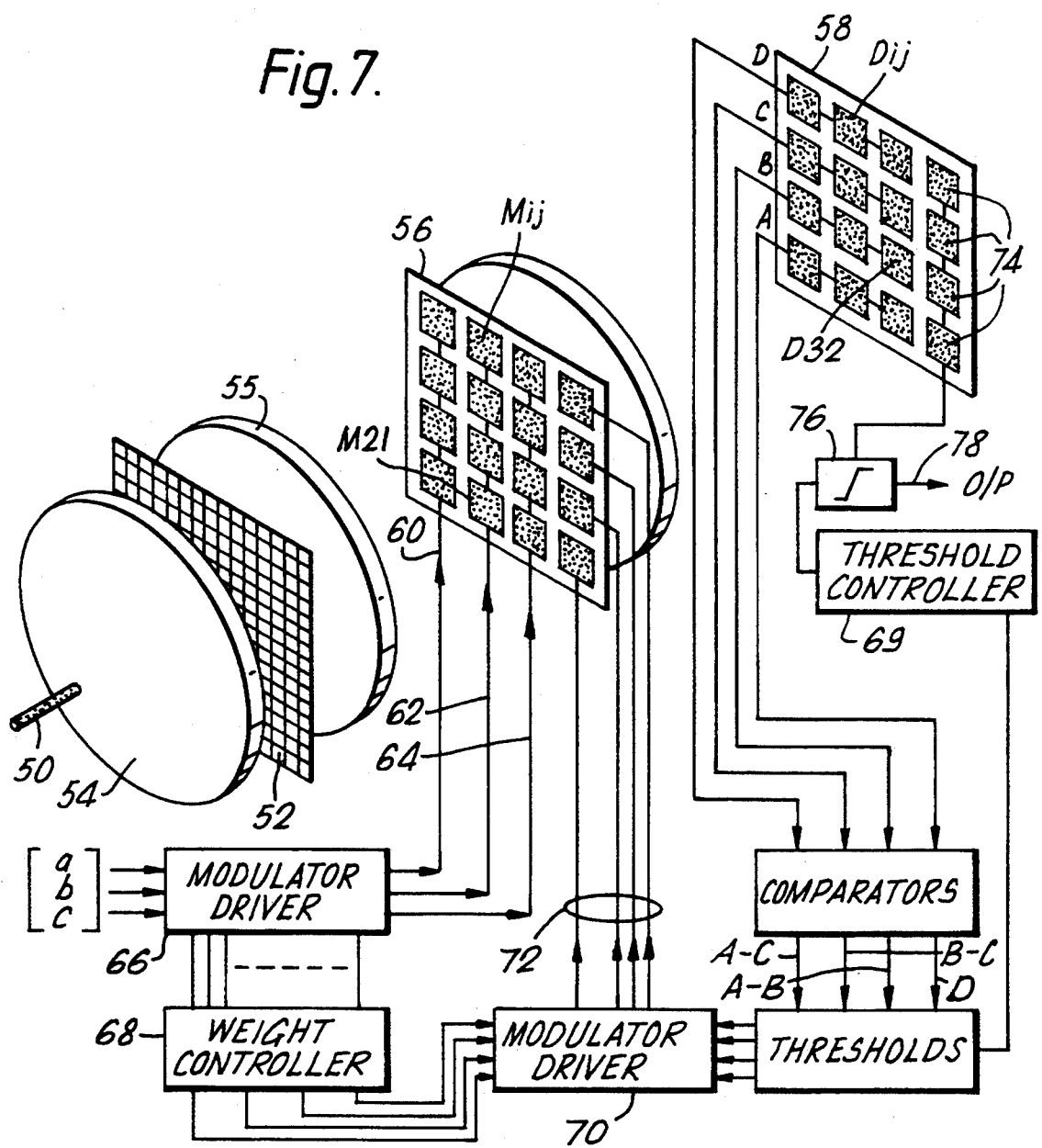
FIG. 7 is a schematic diagram of a further embodiment of an optical neural network according to the present invention.

Referring now to FIG. 7, an optical neural network is configured as the neural network of FIG. 4.

A laser 50 illuminates a computer generated hologram 52 via lenses 54 and 55 which produce a 4×4 array of nominally equal intensity light beams (not shown) which are focussed onto respective modulator elements $M_{ij}$ of a 4×4 modulator array 46. The modulated beams are focussed onto respective detectors $D_{ij}$ of a detector array 48.

For both the modulators $M_{ij}$ and detectors $D_{ij}$, i and j both range from 1 to 4 with i denoting the columns from left to right and j denoting the rows from top to bottom. One exemplary modulator $M_{21}$ and detector $D_{32}$ is referenced to illustrate the indexing scheme.

The modulators $M_{ij}$ and detectors $D_{ij}$ of the first three columns form the first layer of the neural network 50, whilst the fourth column of the modulators $M_{ij}$ and detectors $D_{ij}$ form the second layer of the neural network 50.

There are three, high-speed, binary input channels 60, 62 and 64—each connected to a column of four, independently weighted modulators. Each modulator $M_{ij}$ is individually addressed by a modulator driver 66 with the combination of high-speed logical data (common to each element in the column) and low speed bias voltage from a weight controller 68 to determine the modulation weight. The output from the detectors is $D_{ij}$ summed in rows. Four binary inputs (A–D, B–C, A–C and D), determined from comparators on the A,B,C,D outputs, are thresholded against a bias voltage set by threshold controller 69. These are fed back into the remaining weighted modulators of the fourth column on the modulator array 56 via a modulator driver 70 and a signal bus 72 with weights for the modulators being provided by weight controller 68. The output from the second layer of four detectors 74 is then summed, and thresholded against threshold 6, to give the final, binary output from the network at output 78.

As the weights are coded here as different optical intensities in the beams they must take positive values.

As explained above, the training method when applied asynchronously to the network of FIG. 7 is expected to display rapid training as the high data throughput of the training set will relieve the bottleneck of the simulation of forming the measure of similarity and applying the training set on a general purpose computer.

If, for example the network takes data at a speed of 50 MHz and the training set contains 1000 members, data on the similarity of the set of output vectors and a target set can be collected at the rate of 50 KHz and therefore, in principle, 50,000 iterations can be performed each second (assuming the weight and threshold calculations can be made at this rate) each iteration being calculated on information on all 1000 output vectors rather than on the comparison of only one output vector and a target vector. That is, the training method provides a potential 1000-fold increase in training speed for this exemplary network. The actual increase will depend on the algorithms employed.

The training scheme is described in more detail in the applicant's copending patent application GB9024332.0.

We claim:

1. A neural network comprising:
   beam source means for providing a plurality of weighted intensity input optical beams;
   an array of modulators, each for modulating a respective one of said input optical beams whereby each said modulator produces a respective modulated beam; and
   an array of detectors, each for detecting the modulated beam solely from a respective one of the modulators, said detectors being electrically connected in groups to form nodes, whereby to form sums of the modulated and weighted beam intensities at the nodes;
   wherein the beam source means includes a source of laser radiation, and holographic means operative to split the laser radiation from the source into the plurality of input beams.

2. A network as in claim 1 in which the holographic means comprises:
   a hologram for generating a plurality of substantially equal intensity optical beams, and
   an optical mask between the hologram and the array of optical modulators for providing the weighted intensities of input optical beams.

3. A network as in claim 2 in which the optical mask is removably mounted in the network.

4. A network as in claim 2 in which the mask comprises a spatial light modulator and includes means for altering the spatial light modulator to a desired pattern.

5. A network as in claim 1 in which the holographic means comprises a hologram configured to generate the input optical beams of the required intensities.

6. A network as in claim 1 in which the holographic means is positioned between a pair of collimating lenses.

7. A network as in claim 1 in which the holographic means includes a hologram that is a binary phase pattern.

8. A network as in claim 1 in which the holographic means includes a hologram that is a fixed mask, removably mounted in the network.

9. A network as in claim 1 in which the holographic means comprises a spatial light modulator and includes means for altering the spatial light modulator to a desired pattern.

10. A network as in claim 1 including at least two holograms, any one of which being selectable to provide the plurality of input beams.

11. A network as in claim 10 in which each hologram is illuminatable by a respective optical source.

12. A neural network as claimed in claim 1 wherein the modulators and detectors are arranged in overlying corresponding arrays, with the modulators being electrically interconnected to define array columns, and the detectors being interconnected to define array rows which provide said nodes.

13. A neural network having:
    at least one node responsive to the weighted sum of a plurality of inputs to provide an output dependent on said weighted sum,
    the node comprising an optical detecting means for detecting each of the inputs, and the inputs comprising input optical beams whose intensities determine the weight values of the inputs, and
    the network including a holographic means for generating the input optical beams and an array of optical modulators for controlling which of the input optical beams impinge on the optical detecting means,
    wherein the holographic means incorporates the phase structure of a pair of collimating lenses located one either side of the hologram.

14. A neural network having:
    at least one node responsive to the weighted sum of a plurality of inputs to provide an output dependent on said weighted sum,
    the node comprising an optical detecting means for detecting each of the inputs, and the inputs comprising input optical beams whose intensities determine the weight values of the inputs, and
    the network including a holographic means for generating the input optical beams and an array of optical modulators for controlling which of the input optical beams impinge on the optical detecting means,
    wherein the array of optical modulators and the optical detecting means are formed on respective sides of a common substrate.

15. A network as in claim 14 in which the optical modulators comprise multiple quantum well devices.

16. A network as in claim 15 including a bias means for adjusting the modulation depth of the multiple quantum well devices.

17. A neural network having:
    at least one node responsive to the weighted sum of a plurality of inputs to provide an output dependent on said weighted sum,
    the node comprising an optical detecting means for detecting each of the inputs, and the inputs comprising input optical beams whose intensities determine the weight values of the inputs, and the network including a holographic means for generating the input optical beams and an array of optical modulators disposed between the holographic means and the optical detecting means for controlling which of the input optical beams impinge on the optical detecting means, wherein the optical modulators and optical detecting means are all formed from multiple quantum well devices.

18. A neural network having:

at least one node responsive to a weighted sum of a plurality of inputs to provide an output dependent on said weighted sum, the node comprising an optical detecting means for detecting each of the inputs, and the inputs comprising input optical beams whose intensities determine the weight values of the inputs, and the network including a holographic means for generating the input optical beams and an array of optical modulators for controlling which of the input optical beams impinge on the optical detecting means, wherein the array of optical modulators and the optical detecting means are formed on a common substrate.

* * * * *